United States Patent
Ito et al.

(10) Patent No.: US 8,547,012 B2
(45) Date of Patent: Oct. 1, 2013

(54) ORGANIC ELECTROLUMINESCENT ELEMENT AND LIGHT-EMITTING APPARATUS USING THE SAME

(75) Inventors: Naoyuki Ito, Yokohama (JP); Shoji Sudo, Kawasaki (JP); Takayuki Sumida, Mobara (JP); Takayuki Ito, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 186 days.

(21) Appl. No.: 13/004,753

(22) Filed: Jan. 11, 2011

(65) Prior Publication Data

US 2011/0169399 A1   Jul. 14, 2011

(30) Foreign Application Priority Data

Jan. 14, 2010 (JP) ................................. 2010-005832
Nov. 30, 2010 (JP) ................................. 2010-267292

(51) Int. Cl.
*H05B 33/00* (2006.01)

(52) U.S. Cl.
USPC ............................................ 313/504; 313/506

(58) Field of Classification Search
None
See application file for complete search history.

(56) References Cited

U.S. PATENT DOCUMENTS

| 7,126,269 B2 * | 10/2006 | Yamada ................. 313/504 |
| 2003/0227250 A1 | 12/2003 | Nee |
| 2007/0001586 A1 | 1/2007 | Ryu |
| 2007/0159071 A1 * | 7/2007 | Lee et al. ............... 313/504 |
| 2008/0218069 A1 | 9/2008 | Kim |
| 2009/0102358 A1 | 4/2009 | Shimoji |
| 2010/0123152 A1 | 5/2010 | Sugisawa |
| 2011/0084600 A1 * | 4/2011 | Kim et al. .............. 313/504 |

FOREIGN PATENT DOCUMENTS

| CN | 2283311 Y | 6/1998 |
| CN | 101034375 A | 9/2007 |
| JP | 10-503878 A | 4/1998 |
| JP | 2003-109775 A | 4/2003 |
| JP | 2006-253113 A | 9/2006 |
| JP | 2006-344497 A | 12/2006 |
| JP | 2008-171637 | * 7/2008 |
| JP | 2008-171637 A | 7/2008 |
| JP | 2008-171637 A | 7/2008 |
| JP | 2008-218415 A | 9/2008 |
| JP | 2009-059584 A | 3/2009 |
| JP | 2010-153365 A | 7/2010 |
| KR | 10-2007-0000262 A | 1/2007 |

* cited by examiner

*Primary Examiner* — Ashok Patel
(74) *Attorney, Agent, or Firm* — Canon U.S.A., Inc., IP Division (57) ABSTRACT

An organic EL element includes a first electrode, an organic compound layer, and a second electrode on a substrate. The second electrode includes a first metal layer and a second metal layer in this order from the substrate side. The second metal layer contains Ag and has a thickness of 5.0 nm or more and 20 nm or less. The first metal layer contains Mg and Ag and has a thickness of 1.0 nm or more and 5.0 nm or less.

10 Claims, 3 Drawing Sheets

ORGANIC ELECTROLUMINESCENT ELEMENT AND LIGHT-EMITTING APPARATUS USING THE SAME

BACKGROUND OF THE INVENTION

1. Field of the Invention

The present invention relates to an organic electroluminescent (EL) element that includes a silver thin film electrode and has high luminous efficiency and to a light-emitting apparatus that includes the organic EL element.

2. Description of the Related Art

An organic EL element includes a first electrode, a second electrode, and an organic compound layer disposed between the two electrodes. Light produced in a light-emitting layer in the organic compound layer is extracted from the first electrode or the second electrode (a light extraction electrode). It has been proposed that a silver thin film is used as the light extraction electrode. Silver has high electrical conductivity and high transmittance in the visible light region.

However, a silver thin film having a thickness of 20 nm or less is generally a discontinuous film, having not only a small electric conductivity but also low transmittance in the visible light region because of absorption resulting from local surface plasmon resonance. In order to prevent the absorption due to local surface plasmon resonance of the silver thin film, Japanese Patent Laid-Open No. 2008-171637 discloses an organic EL element that includes an electrode formed of a layered transparent electroconductive film. The layered transparent electroconductive film is composed of an underlying layer formed of a metal other than silver and a silver thin film layer formed of silver or a silver alloy. The metal other than silver is preferably selected from the group consisting of gold, aluminum, copper, indium, tin, and zinc.

As a result of diligent research, however, the present inventors found that the structure of the layered transparent electroconductive film according to Japanese Patent Laid-Open No. 2008-171637 could not sufficiently prevent absorption due to local surface plasmon resonance.

SUMMARY OF THE INVENTION

The present invention provides an organic EL element that includes a silver thin film electrode and has high luminous efficiency.

The present invention provides an organic EL element that includes a first electrode, a second electrode, and an organic compound layer on a substrate. The organic compound layer has a light-emitting layer arranged between the first electrode and the second electrode. The second electrode includes a first metal layer and a second metal layer in this order from the substrate side. The second metal layer is in contact with the first metal layer. The second metal layer contains Ag and has a thickness of 5.0 nm or more and 20 nm or less. The first metal layer contains Mg and Ag and has a thickness of 1.0 nm or more and 5.0 nm or less.

The present invention can provide an organic EL element that includes a silver thin film electrode and has high luminous efficiency.

Further features of the present invention will become apparent from the following description of exemplary embodiments with reference to the attached drawings.

DESCRIPTION OF THE EMBODIMENTS

First Embodiment

Figure 1A:
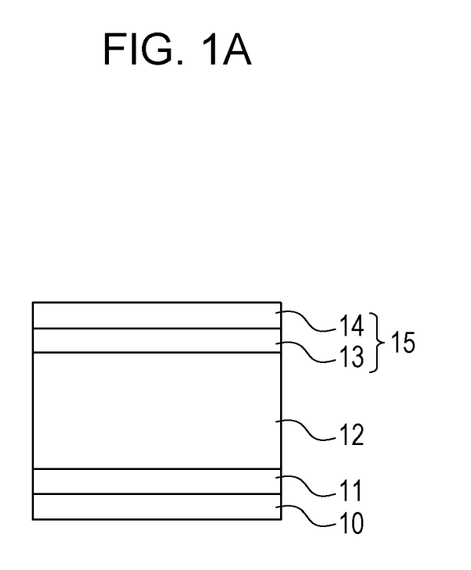
FIG. 1A is a schematic cross-sectional view of an organic EL element according to an embodiment of the present invention.

The present invention will be described below with reference to the drawings. FIG. 1A is a schematic cross-sectional view of an organic EL element according to a first embodiment of the present invention. The organic EL element according to the first embodiment of the present invention includes a first electrode 11, a second electrode 15, and an organic compound layer 12 on a substrate 10. The organic compound layer 12 is disposed between the first electrode 11 and the second electrode 15 and includes a light-emitting layer. Light is extracted from the second electrode 15 opposite to the substrate 10 (a top emission type). The second electrode 15 includes a first metal layer 13 and a second metal layer 14 in this order from the substrate 10. The second metal layer 14 is in contact with the first metal layer 13. The second metal layer 14 contains silver (Ag) and has a thickness of 5.0 nm or more and 20 nm or less. The first metal layer 13 serving as an underlying layer of the second metal layer 14 contains Mg and Ag and has a thickness of 1.0 nm or more and 5.0 nm or less. This can make the second metal layer 14 a continuous film, thereby preventing local surface plasmon absorption and a decrease in the transmittance of the second metal layer 14.

Although not shown, the present invention can be applied to organic EL elements of a bottom emission type, in which light is extracted from the substrate. More specifically, an organic EL element of a bottom emission type has a second electrode, an organic compound layer, and a first electrode in this order from the substrate. The second electrode includes a first metal layer and a second metal layer in this order from the substrate.

The second metal layer 14 of the second electrode 15 is formed of a Ag thin film containing preferably 90% by volume or more of Ag. The Ag thin film may contain a small amount (less than 10% by volume) of Pd, Cu, Mg, and/or Au. The second metal layer 14 preferably has a thickness of 5.0 nm or more and 20 nm or less, more preferably 8.0 nm or more and 12 nm or less, to achieve high electric conductivity and transmittance in the visible light region (wavelength: 400 to 780 nm).

The first metal layer 13 of the second electrode 15 contains at least two metals. Examples of the at least two metals include, but are not limited to, metals, such as Ag and Au, Group I elements, such as Li and Cs, Group II elements, such as Mg and Ca, and Group III elements, such as Al and In. The first metal layer 13 suitably contains Mg and Ag. The atomic ratio of Mg to Ag preferably ranges from 19:1 to 1:19, more preferably 19:1 to 9:1. In the case that the first metal layer 13 has a thickness of 10 nm or less, the local surface plasmon absorption of the second metal layer 14 (Ag thin film) increases with increasing volume percentage of Ag.

It is desirable that the second metal layer 14 (Ag thin film) be formed of a continuous film. A discontinuous Ag thin film insufficiently covering the first metal layer 13 results in the generation of local surface plasmon absorption characteristic of a Ag thin film and has low electric conductivity. It is therefore desirable that the first metal layer 13 underlying the second metal layer 14 also be formed of a continuous film and sufficiently cover the underlying organic compound layer (in the case of the top emission type) or the substrate (in the case of the bottom emission type). It is also desirable that the interface between the first metal layer 13 and the second metal layer 14 be flat. To this end, the first metal layer 13 contains at least two metals.

The continuity of a layer is probably relevant to the physical properties of metal atoms of different types. In such a case, one of the physical properties would be related to the bonding strength between the atoms. In the vapor deposition of metal, it is believed that a metal atom having a high bonding strength with an atom of the substrate forms three-dimensional bonding, whereas a metal atom having a low bonding strength with an atom of the substrate forms two-dimensional bonding (in the in-plane direction of the substrate). In particular, in the vapor deposition of at least two metals having different bonding strengths, it is believed that a metal having a high bonding strength forms a core, and a metal having a low bonding strength grows two-dimensionally around the core, thus easily forming a continuous film. In the first metal layer 13 containing Mg and Ag, it is believed that a combination of Mg having a low bonding strength and Ag having a high bonding strength with respect to the substrate facilitates the formation of a continuous film.

Another of the physical properties probably be related to the size of the core, that is, the atomic radius. It is believed that metal atoms of different types fill the space between the metal atoms, thereby easily forming a continuous film. It is particularly desirable that the at least two metals have a large difference in atomic radius because the space between metal atoms having a larger atomic radius can be filled with metal atoms having a smaller atomic radius. Examples of the metal atoms having a larger atomic radius include, but are not limited to, Ag and Au. Examples of the metal atoms having a smaller atomic radius include, but are not limited to, Li, Cs, Mg, Ca, Al, and In. It is desirable that the first metal layer contain a metal having a large atomic radius, such as Ag or Au, and a metal having a small atomic radius as described above. In the first metal layer 13 containing Mg and Ag, it is believed that a large difference in atomic radius between Mg and Ag can sufficiently produce the effects described above, thereby facilitating the formation of a continuous film. It is also believed that the inclusion of Ag in the first metal layer increases the affinity between the first metal layer and the second metal layer, and the second metal layer (Ag thin film) can form a continuous film with the aid of Ag in the first metal layer.

It is desirable that the first metal layer have a smaller thickness than the second metal layer. The first metal layer preferably has a thickness of 1.0 nm or more and 5.0 nm or less. In this film thickness range, the second electrode 15 disposed on the organic compound layer has high transmittance and sufficiently high reflectivity. This increases the optical coherence between the first electrode 11 and the second electrode 15 and improves luminous efficiency. The first metal layer more preferably has a thickness of 1.0 nm or more and 2.0 nm or less. The first metal layer having a thickness of 1.0 nm or more and 5.0 nm or less has high luminous transmittance taking visibility in white display into account. The term "luminous transmittance", as used herein, refers to the sum of the products of the transmittance of the first metal layer (or a laminate of the first metal layer and the second metal layer) for red, green, and blue light and the visibility of red, green, and blue light. The red, green, and blue light have, but are not limited to, a wavelength of 620, 520, and 460 nm, respectively. The red, green, and blue light have visibility of 0.30, 0.59, and 0.11, respectively. In a light-emitting apparatus including organic EL elements that can emit red, green, and blue light, if the light extraction electrodes have the same thickness and composition, high luminous transmittance results in low power consumption of the light-emitting apparatus in white light emission.

Other components of the organic EL element will be described below. The substrate 10 may be formed of a dielectric material, such as glass or plastic. The substrate 10 may include a supporting substrate, a switching element disposed on the supporting substrate, and an insulating layer disposed on the switching element. The switching element may be a thin-film transistor (TFT) and drives an organic EL element.

It is desirable that the first electrode 11 have high reflectivity. The first electrode 11 may be a metal layer formed of Al, Ag, Mo, W, Ni, Cr, or an alloy thereof and may have a thickness of 50 nm or more and 300 nm or less. This metal layer can be formed by a known method, such as vapor deposition or sputtering. The first electrode may include a transparent electroconductive oxide layer on the light extraction side of the metal layer. The transparent electroconductive oxide layer may be formed of $SnO_2$, $In_2O_3$, or indium tin oxide (ITO). The transparent electroconductive oxide layer preferably has a thickness of 5 nm or more and 100 nm or less. The term "transparent", as used herein, refers to transmittance of 40% or more in the visible light region.

The organic compound layer 12 includes a light-emitting layer and optionally includes functional layers, such as a hole-injection layer, a hole-transport layer, a hole-blocking layer, an electron-injection layer, an electron-transport layer, and/or an electron-blocking layer. The functional layers are layered in an appropriate order. Each of the functional layers of the organic compound layer may be formed of a known material.

The second electrode 15 may be covered with a protective layer, such as the transparent electroconductive oxide layer described above, an organic compound layer having a high refractive index, or SiN.

Second Embodiment

Figure 1B:
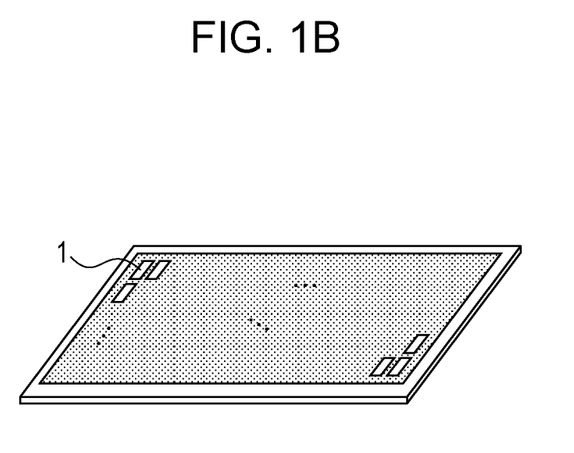
FIG. 1B is a schematic perspective view of a light-emitting apparatus including the organic EL element.

Another embodiment of the present invention will be described below. As illustrated in FIG. 1B, a light-emitting apparatus according to an embodiment of the present invention includes a plurality of pixels 1 each including an organic EL element. The light-emitting apparatus also includes a control unit, such as a TFT, to control the light emission of the pixels. Each of the pixels 1 includes an organic EL element according to an embodiment of the present invention.

This light-emitting apparatus can be used as a display apparatus. Such a light-emitting apparatus includes a matrix of pixel units. Each of the pixel units includes a plurality of pixels having different luminescent colors, for example, a red-light-emitting pixel, a green-light-emitting pixel, and a blue-light-emitting pixel. For example, the red-light-emitting pixel includes an organic EL element that can emit red light.

The term "pixel", as used herein, refers to the smallest unit in which light emission can be independently controlled. A pixel unit includes a plurality of pixels having different luminescent colors and can emit a desired color by color mixing.

In the present embodiment, all the pixels may be an organic EL element according to an embodiment of the present invention, or part of the pixels may be an organic EL element according to an embodiment of the present invention. In other words, the pixels may include both organic EL elements according to an embodiment of the present invention and conventional organic EL elements. The ratio of the organic EL elements according to an embodiment of the present invention to the conventional organic EL elements can be adjusted to the light-emitting properties of the display apparatus.

The organic EL elements according to an embodiment of the present invention and the conventional organic EL elements may be arranged regularly. Alternatively, the organic EL elements according to an embodiment of the present invention may be distributed irregularly.

In a light-emitting apparatus including a red-light-emitting pixel, a green-light-emitting pixel, and a blue-light-emitting pixel, it is desirable that each of the pixels has an organic EL element according to an embodiment of the present invention.

The pixels may include a unit for improving light extraction efficiency. All the pixels may include this improving unit, or particular pixels may include this improving unit.

A light-emitting apparatus according to the present invention can be used in various applications, such as illumination, printer heads, exposure apparatuses, and backlights for display apparatuses. Examples of a light-emitting apparatus according to an embodiment of the present invention used as display apparatuses include, but are not limited to, displays of television systems and personal computers, back side displays of image pickup apparatuses, displays of mobile phones, and displays of portable game machines. Other examples of a light-emitting apparatus according to an embodiment of the present invention used as display apparatuses include, but are not limited to, displays of portable music players, displays of personal digital assistants (PDA), and displays of car navigation systems.

EXAMPLES

Transmittance measurements will be described below for a structure in which a laminate of a first metal layer and a second metal layer of a second electrode according to an embodiment of the present invention is disposed on an organic compound layer.

Reference Example 1

In the present reference example, an organic compound layer was formed on a quartz substrate, a Mg—Ag metal layer was formed on the organic compound layer as a first metal layer, and a Ag layer was formed on the Mg—Ag metal layer as a second metal layer. The concentration of Ag in the Mg—Ag metal layer was altered.

An organic compound layer formed of a compound 1 described below and having a thickness of 20 nm was formed on a quartz substrate (20 mm×20 mm×0.7 mm in thickness). A Mg—Ag metal layer was then formed on the organic compound layer as a first metal layer. The volume percentage of Ag in the Mg—Ag metal layer was altered as follows: 0, 5, 10, 20, 30, 50, 80, and 100% by volume. The total deposition rate of Mg and Ag was 1.0 angstrom/second. The individual deposition rates of Mg and Ag were adjusted such that the volume percentage of Ag in the first metal layer was 0%, 5%, 10%, 20%, 30%, 50%, 80%, or 100% by volume. For example, when the volume percentage of Ag was 20% of the first metal layer, the deposition rate of Mg was 0.8 angstroms/second, and the deposition rate of Ag was 0.2 angstroms/second. The degree of vacuum of an evaporation chamber was $2\times10^{-5}$ Pa or more and $8\times10^{-5}$ Pa or less during the deposition. The first metal layer had a thickness of 4.0 nm independently of the Ag concentration. A second metal layer having a thickness of 10 nm was then formed on the first metal layer at a Ag deposition rate of 0.5 angstroms/second. In order to prevent the oxidation of the first metal layer formed on the quartz substrate in the atmosphere, the deposition surface of the quartz substrate was sealed with a sealing glass (18 mm×18 mm×0.7 mm in thickness) and an epoxy resin adhesive.

Compound 1

Reference Example 2

In the present reference example, an organic compound layer was formed on a quartz substrate, a Mg—Ag metal layer was formed on the organic compound layer as a first metal layer, and a Ag layer was formed on the Mg—Ag metal layer as a second metal layer. The thickness of the Mg—Ag metal layer was altered.

The organic compound layer formed on the quartz substrate was formed of the compound 1 and had a thickness of 20 nm. The volume percentage of Ag in the Mg—Ag metal layer formed on the organic compound layer as a first metal layer was 10% by volume of the metal layer. The thickness of the first metal layer was altered as follows: 0.5 nm and 1.0 to 10 nm in increments of 1 nm. The thin Ag layer (second metal layer) was formed on the first metal layer at a Ag deposition rate of 0.5 angstroms/second and had a thickness of 10 nm. The other conditions are described in Reference Example 1.

Comparative Example 1

An organic compound layer formed of the compound 1 and having a thickness of 20 nm was formed on a quartz substrate. An Al layer having a thickness of 2.0 nm was then formed on the organic compound layer as a first metal layer at a deposition rate of 0.5 angstroms/second. A thin Ag layer (second metal layer) having a thickness of 10 nm was then formed on the first metal layer at a Ag deposition rate of 0.5 angstroms/second. The other conditions are described in Reference Example 1.

Measurement of Transmittance

Figure 2A:
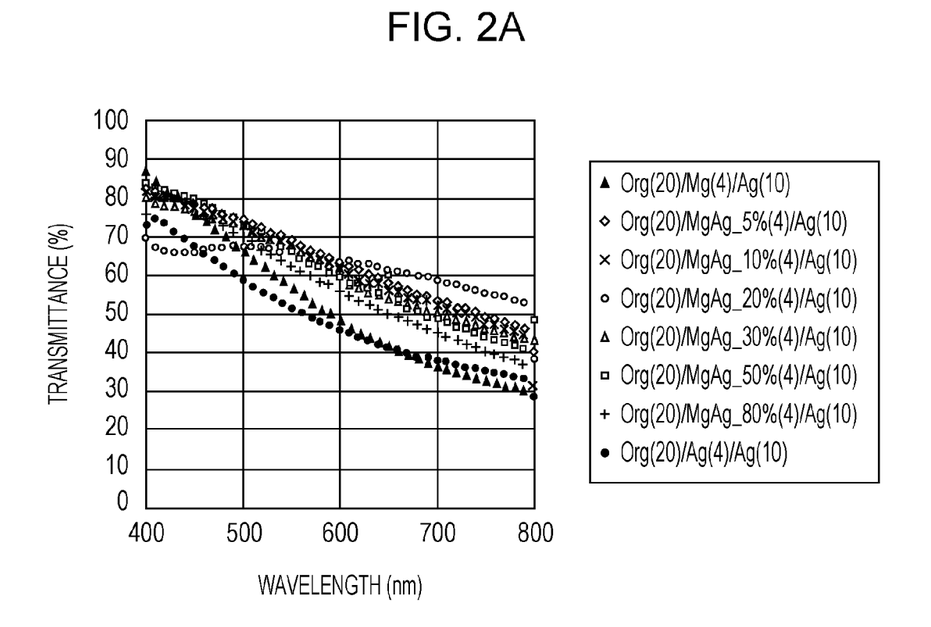
FIG. 2A is a graph showing the transmittance of Reference Example 1.
Figure 2B:
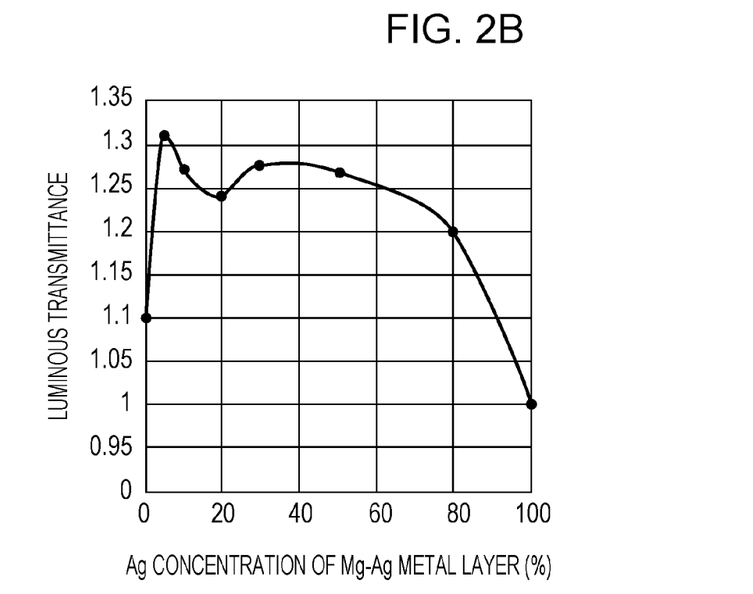
FIG. 2B is a graph showing the dependence of the luminous transmittance of a Mg—Ag metal layer on the Ag concentration.

The transmittance of Reference Examples 1 and 2 and Comparative Example 1 was measured with Ubest V-560 (manufactured by JASCO Co.). A reference sample was a quartz substrate sealed with a sealing glass. The quartz substrate had the same lot number as the quartz substrates used in the reference examples and the comparative example. FIG. 2A shows the transmittance of Reference Example 1. FIG. 2B shows the dependence of the luminous transmittance of a Mg—Ag metal layer on the Ag concentration. The luminous transmittance at a Ag concentration of 100% by volume was taken as 1. As shown in FIG. 2A, the laminates of the Mg—Ag metal layer and the thin Ag layer had smaller variations in transmittance than the laminates of the Ag monolayer or the Mg monolayer and the thin Ag layer in the visible region. In particular, the laminates of the Mg—Ag metal layer and the thin Ag layer had high transmittance at long wavelengths (600 nm or more). As shown in FIG. 2B, at a Ag concentration of the first metal layer of more than 0% by volume and 80% by volume or less, the laminates of the Mg—Ag metal layer and the thin Ag layer had higher luminous transmittance than the laminates of the Ag monolayer or the Mg monolayer and the thin Ag layer. FIG. 2B shows that the Ag concentration is more preferably 5% by volume or more and 50% by volume or less, still more preferably 30% by volume or more and 50% by volume or less. A decrease in luminous transmittance at a Ag concentration of 20% by volume is within the limits of error.

The volume percentage may be substituted by the weight percentage. More specifically, the volume percentage X can be converted into the weight percentage Y by the following equation: $Y=100/(1+\rho(100/X-1))$, wherein $\rho$ denotes the density ratio of Mg to Ag. Since Mg has a density of 1.74 g/cm$^3$ and Ag has a density of 10.50 g/cm$^3$, $\rho$ is 0.166. Thus, $X=80$ is converted into $Y=96.02$, and $X=50$ is converted into $Y=85.79$. More than 0% by volume and 80% by volume or less of Ag in the Mg—Ag metal layer corresponds to more than 0.0% by weight and 96.0% by weight or less of Ag in the Mg—Ag metal layer. 5% by volume or more and 50% by volume or less of Ag in the Mg—Ag metal layer corresponds to 24.1% by weight or more and 85.8% by weight or less of Ag in the Mg—Ag metal layer. 30% by volume or more and 50% by volume or less of Ag in the Mg—Ag metal layer corresponds to 72.1% by weight or more and 85.8% by weight or less of Ag in the Mg—Ag metal layer. The weight percentage is accurate to the first decimal place. The second metal layer 14 is preferably 83.0% by weight or more, suitably 90.0% by weight or more.

Figure 3A:
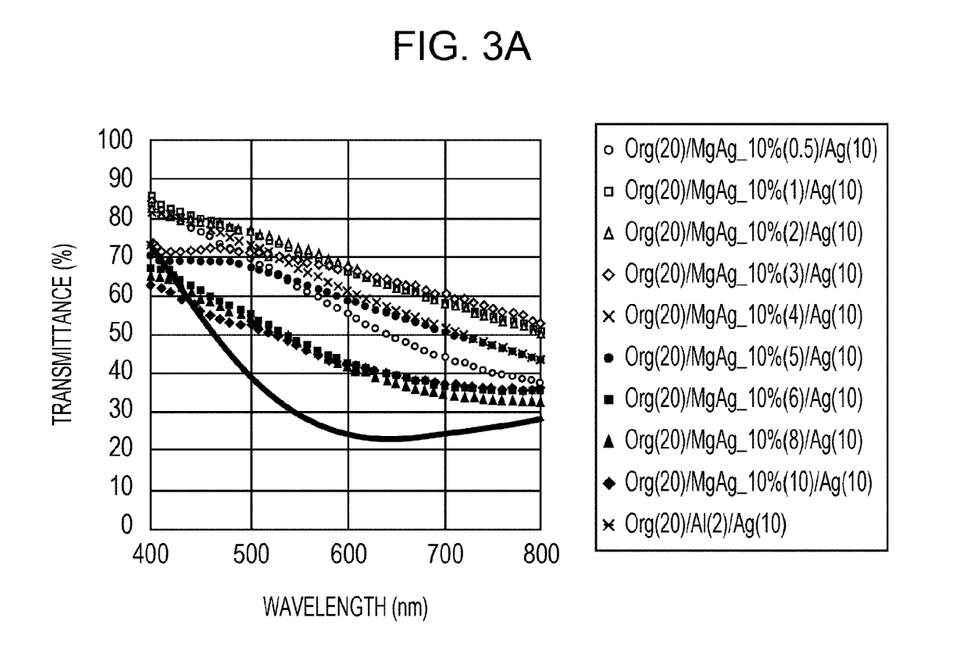
FIG. 3A is a graph showing the transmittance of Reference Example 2.
Figure 3B:
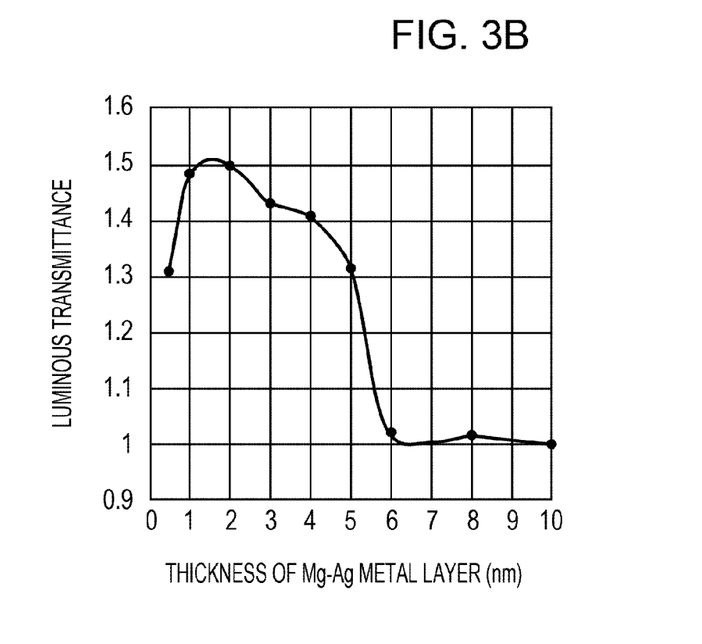
FIG. 3B is a graph showing the thickness dependence of the luminous transmittance of a Mg—Ag metal layer.

FIG. 3A shows the transmittance of Reference Example 2 and Comparative Example 1. FIG. 3B shows the thickness dependence of the luminous transmittance of the Mg—Ag metal layer. The luminous transmittance of a Mg—Ag metal layer having a thickness of 10 nm was taken as 1. As shown in FIG. 3A, the first metal layers having a thickness of 1.0 nm or more and 5.0 nm or less had high transmittance in the whole wavelength range. The first metal layers having a thickness of 1.0 nm or more and 2.0 nm or less resulted in higher transmittance. The first metal layers having a thickness of 1.0 nm or more and 5.0 nm or less also resulted in high luminous transmittance. The first metal layers having a thickness of 1.0 nm or more and 2.0 nm or less resulted in higher luminous transmittance.

Comparative Example 1 had low transmittance. This is probably because the underlying Al monolayer having a thickness of 2 nm was a discontinuous film, and the thin Ag layer was also a discontinuous film, resulting in insufficient prevention of local surface plasmon absorption.

An organic EL element according to an embodiment of the present invention will be described below. The organic EL elements described below are of a top emission type.

Example 1

The present example describes a blue organic EL element having a structure illustrated in FIG. 1. A first electrode 11 was formed on a glass substrate 10 by forming an aluminum alloy (AlNd) film having a thickness of 100 nm by sputtering and subsequently forming an InZnO film having a thickness of 40 nm by sputtering.

An organic compound layer 12 was then formed in the following manner. First, a first hole-transport layer having a thickness of 90 nm was formed by the deposition of a compound 2 described below. A second hole-transport layer having a thickness of 10 nm was then formed by the deposition of a compound 3 described below. A light-emitting layer having a thickness of 35 nm was then formed by the co-evaporation of a compound 4 and a compound 5 described below at a deposition rate of 0.98 and 0.02 angstroms/second, respectively. An electron-transport layer having a thickness of 60 nm was then formed by the vapor deposition of the compound 1. An electron-injection layer having a thickness of 0.5 nm was then formed by the vapor deposition of LiF.

Compound 2

Compound 3

Compound 4

Compound 5

A Mg—Ag metal layer having a thickness of 2.0 nm was then formed as a first metal layer 13 of a second electrode 15 at a Mg deposition rate of 0.9 angstroms/second and a Ag deposition rate of 0.1 angstroms/second. A Ag thin film having a thickness of 10 nm was then formed on the Mg—Ag metal layer as a second metal layer 14 at a Ag deposition rate of 0.5 angstroms/second.

Finally, the deposition surface of the glass substrate was sealed with an epoxy resin adhesive and a sealing glass (not shown) containing a drying agent in a nitrogen atmosphere in a glove box.

Comparative Example 2

The layers up to the electron-injection layer were formed in the same way as Example 1. A Ag film having a thickness of 10 nm was then formed as a second electrode. The first metal layer was not formed. The glass substrate was sealed in the same way as Example 1.

Comparative Example 3

The layers up to the electron-injection layer were formed in the same way as Example 1. A Mg—Ag metal layer having a thickness of 5.0 nm was then formed as a first metal layer of a second electrode at a Mg deposition rate of 0.9 angstroms/second and a Ag deposition rate of 0.1 angstroms/second. A Mg—Ag metal layer having a thickness of 10 nm was then formed on the first metal layer as a second metal layer at a Mg deposition rate of 0.8 angstroms/second and Ag deposition rate of 0.2 angstroms/second. This Mg—Ag metal layer contained Mg as the main component. The glass substrate was sealed in the same way as Example 1.

Evaluation of Element

The current efficiency and the emission spectrum of the blue organic EL elements fabricated in Example 1 and Comparative Example 3 were measured. The current efficiencies of Example 1 and Comparative Example 3 were 4.2 and 2.9 cd/A, respectively. The organic EL element according to Example 1 of the present invention had higher luminous efficiency. The organic EL element according to Comparative Example 2 did not emit light. This is probably because the second electrode was a discontinuous film.

Example 2

The present example describes a green organic EL element. In the present example, a second hole-transport layer was not formed. A light-emitting layer having a thickness of 30 nm was formed by the co-evaporation of a compound 6 and a compound 7 described below at a deposition rate of 0.98 and 0.02 angstroms/second, respectively. The other components and forming methods are described in Example 1.

Compound 6

Compound 7

Comparative Example 4

The layers other than the second electrode were formed in the same way as the green organic EL element according to Example 2. A Mg—Ag metal layer having a thickness of 5.0 nm was then formed as a first metal layer of a second electrode at a Mg deposition rate of 0.9 angstroms/second and a Ag deposition rate of 0.1 angstroms/second. A Mg—Ag metal layer having a thickness of 10 nm was then formed on the first metal layer as a second metal layer at a Mg deposition rate of 0.8 angstroms/second and Ag deposition rate of 0.2 angstroms/second. This Mg—Ag metal layer contained Mg as the main component. The glass substrate was sealed in the same way as Example 1.

Evaluation of Element

The current efficiency and the emission spectrum of the blue organic EL elements fabricated in Example 2 and Comparative Example 4 were measured. The current efficiencies of Example 2 and Comparative Example 4 were 19.8 and 13.9 cd/A, respectively. The organic EL element according to Example 2 of the present invention had higher luminous efficiency.

Example 3

The present example describes a red organic EL element. In the present example, a second hole-transport layer was not formed. A light-emitting layer having a thickness of 30 nm was formed by the co-evaporation of a compound 8, a compound 9, and a compound 10 described below at a deposition rate of 0.68, 0.02, and 0.30 angstroms/second, respectively. The other components and forming methods are described in Example 1.

Compound 8

Compound 9

Compound 10

Comparative Example 5

The layers other than the second electrode were formed in the same way as the red organic EL element according to Example 3. A Mg—Ag metal layer having a thickness of 5.0 nm was then formed as a first metal layer of a second electrode at a Mg deposition rate of 0.9 angstroms/second and a Ag deposition rate of 0.1 angstroms/second. A Mg—Ag metal layer having a thickness of 10 nm was then formed on the first metal layer as a second metal layer at a Mg deposition rate of 0.8 angstroms/second and Ag deposition rate of 0.2 angstroms/second. This Mg—Ag metal layer contained Mg as the main component. The glass substrate was sealed in the same way as Example 1.

Evaluation of Element

The current efficiency and the emission spectrum of the red organic EL elements fabricated in Example 3 and Comparative Example 5 were measured. The current efficiencies of Example 3 and Comparative Example 5 were 10.6 and 8.5 cd/A, respectively. The organic EL element according to Example 3 of the present invention had higher luminous efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-005832 filed Jan. 14, 2010 and Japanese Patent Application No. 2010-267292 filed Nov. 30, 2010, which are hereby incorporated by reference herein in their entirety.

What is claimed is:

1. An organic EL element comprising:
    a first electrode;
    a second electrode; and
    an organic compound layer on a substrate, the organic compound layer having a light-emitting layer arranged between the first electrode and the second electrode,
    wherein the second electrode includes a first metal layer and a second metal layer in this order from the substrate side, the second metal layer being in contact with the first metal layer,
    the second metal layer contains Ag and has a thickness of 5.0 nm or more and 20 nm or less, and
    the first metal layer contains Mg and Ag and has a thickness of 1.0 nm or more and 5.0 nm or less.

2. The organic EL element according to claim 1, wherein the volume percentage of Ag in the metal layer containing Mg and Ag is more than 0% and 80% or less.

3. The organic EL element according to claim 1, wherein the volume percentage of Ag in the metal layer containing Mg and Ag is 5% or more and 50% or less.

4. The organic EL element according to claim 1, wherein the volume percentage of Ag in the metal layer containing Mg and Ag is 30% or more and 50% or less.

5. The organic EL element according to claim 1, wherein the weight percentage of Ag in the metal layer containing Mg and Ag is more than 0.0% and 96.0% or less.

6. The organic EL element according to claim 1, wherein the weight percentage of Ag in the metal layer containing Mg and Ag is 24.1% or more and 85.8% or less.

7. The organic EL element according to claim 1, wherein the weight percentage of Ag in the metal layer containing Mg and Ag is 72.1% or more and 85.8% or less.

8. The organic EL element according to claim 1, wherein the first metal layer has a thickness of 1.0 nm or more and 2.0 nm or less.

9. A light-emitting apparatus comprising:
   a plurality of pixels each including an organic EL element; and
   a control unit configured to control the light emission of the pixels,
   wherein the organic EL element is an organic EL element according to claim 1.

10. The light-emitting apparatus according to claim 9, wherein the plurality of pixels include a red-light-emitting pixel, a green-light-emitting pixel, and a blue-light-emitting pixel.

\* \* \* \* \*